United States Patent [19]
Seok

[11] Patent Number: 6,124,605
[45] Date of Patent: Sep. 26, 2000

[54] INSULATED GATE BIPOLAR TRANSISTOR WITH LATCH-UP PROTECTION

[75] Inventor: Kyoung-Wook Seok, Seoul, Rep. of Korea

[73] Assignee: Samsung Electronics Co., Ltd., Suwon, Rep. of Korea

[21] Appl. No.: 09/129,997

[22] Filed: Aug. 6, 1998

[30] Foreign Application Priority Data

Aug. 6, 1997 [KR] Rep. of Korea ................... 97-37637

[51] Int. Cl.[7] .................................................. H01L 29/74
[52] U.S. Cl. ........................................... 257/133; 257/135
[58] Field of Search .................................. 257/133, 135, 257/150, 151, 153

[56] References Cited

U.S. PATENT DOCUMENTS

| | | |
|---|---|---|
| 4,356,503 | 10/1982 | Shafer et al. . |
| 5,099,300 | 3/1992 | Baliga . |
| 5,757,034 | 5/1998 | Ajit . |
| 5,796,124 | 8/1998 | Nakanishi et al. . |
| 5,874,751 | 2/1999 | Iwamuro et al. . |

*Primary Examiner*—Stephen D. Meier
*Attorney, Agent, or Firm*—Jones Volentine, L.L.P.

[57] ABSTRACT

An insulated gate bipolar transistor (IGBT) with latch-up protection includes a plurality of base layers of a first conductive type with upper and lower sides, a plurality of base regions of a second conductive type embedded in the upper side of the base layer, a plurality of source regions of the first conductive type embedded in the a plurality of base regions, a gate electrode formed over the base layer, an insulating layer formed between the gate electrode and the base layer, and a main electrode connected to the source region and the base regions. The gate electrode is formed into an elongated curved line with concave and convex parts. Each of the source regions includes a primary source region and plurality of projections. The primary source regions are formed on both sides of the gate electrode such that an intermediate area is formed adjacent to the source regions in each of the base regions and under the gate electrode. Each of the plurality of projections extends from outside of the convex parts of the gate electrode to fill the intermediate region. The first main electrode contacts the source region projections at areas adjacent the convex parts of the gate electrode, and contacts the intermediate region in the base regions at all other points, thereby preventing latch-up.

12 Claims, 5 Drawing Sheets

INSULATED GATE BIPOLAR TRANSISTOR WITH LATCH-UP PROTECTION

FIELD OF THE INVENTION

The present invention concerns an insulated gate bipolar transistor (IGBT), and more particularly a means for protecting the insulated gate bipolar transistor from a latch-up that may cause destruction of the bipolar transistor due to a short circuit between the source region and the base layer.

BACKGROUND OF THE INVENTION

Referring to FIG. 1, a conventional IGBT comprises a $p^{++}$-type emitter layer 1, an $n^+$-type buffer layer 2, an $n^-$-type base layer 3, a p-type base region 4, an $n^+$-type source region 5, an insulating layer 6, a gate electrode 7, a cathode electrode 8, and an anode electrode 9. The conventional IGBT has both a hole current 10 and an electron current 11 flowing though it.

The p-type base region 4 is embedded in an upper region of the $n^-$-type base layer 3, and the $n^+$-type source region 5 is further embedded in the p-type base region 4. The gate electrode 7 is formed over the $n^-$-type base layer 3, and is wholly enclosed by the insulating layer 6. The p-type base region 4 and the $n^+$-type source region 5 are electrically connected to the cathode electrode 8. The $n^+$-type buffer layer 2 is formed on the lower side of the $n^-$-type base layer 3. In addition, the $p^{++}$-type emitter layer 1, electrically connected with the anode electrode 9, is formed on the lower side of the buffer layer 2. In operation, the hole current 10 flows from the anode electrode 9 to the cathode electrode 8, and the electron current 11 flows in a reverse direction.

The equivalent circuit of FIG. 1 is shown in FIG. 2. This equivalent circuit includes the gate electrode 7, the cathode electrode 8, the anode electrode 9, an NMOS transistor 12, an NPN transistor 13, a PNP transistor 14, first through third nodes 15–17, and a resistor $R_b$.

The NMOS transistor 12 is connected in parallel with the NPN transistor 13. The NMOS transistor 12 has its current path connected between the first and second nodes 15 and 16, and its gate connected to the gate electrode 7. The NPN transistor 13 has its emitter connected to the first node 15, its collector connected to the second node 16, and its gate connected to the third node 17. The PNP transistor 14 has its collector connected to the third node, its emitter connected to the cathode electrode 8, and its base connected to the second node 16. The resistor $R_b$ is connected between the third node 17 and the cathode electrode 8. In addition, the first node 15 is connected to the cathode electrode 8.

In the conventional IGBT described above, latch-up is caused by the hole current 10 flowing in the lower part of the $n^+$-type source region 5 and its resistance $R_b$. More specifically, the hole current 10 and resistance $R_b$ increase the voltage between the p/n junction on the right side of the $n^+$-type source region 5. Hence, a charge transfer injection occurs in the p/n junction so that the electrons flow from the $n^+$-type source region 5 to the $n^-$-type base layer 3 without passing the channel below the gate electrode 7. This causes latch-up since the current is not cut off from the device even when a negative voltage is applied to the gate electrode 7.

The latch-up determines the maximum current allowable for the device, and the time that the device can endure a short circuit. The short circuit causes high voltage and high current to be applied to the device, rapidly increasing its temperature. This in turn lowers the voltage required to initiate the charge transfer injection in the p/n junction between the p-type base region 4 and the $n^+$-type source region 5. As a result of this, current cannot be prevented from flowing into the device if the operation of the protection circuit is delayed, and the device can be destroyed.

SUMMARY OF THE INVENTION

It is an object of the present invention to provide an IGBT device with latch-up protection.

According to an embodiment of the present invention, an insulated gate bipolar transistor is provided, comprising a plurality of base layers of a first conductive type with upper and lower sides, a plurality of base regions of a second conductive type selectively embedded in the upper side of the base layer, a plurality of source regions of the first conductive type selectively embedded in the a plurality of base regions, a gate electrode formed over the base layer and the a plurality of base regions, an insulating layer formed between the gate electrode and both the base layer and the plurality of base regions, and a first main electrode connected to the source region and to the plurality of base regions.

The gate electrode is preferably formed either into an elongated curved line with concave and convex parts, or an elongated curved strip with concave, convex, and rectilinear parts.

Each of the plurality of source regions preferably comprises a primary source region and plurality of projections.

The plurality of primary source regions are preferably formed on both sides of the gate electrode such that an intermediate area is formed adjacent to the source regions in each of the plurality of base regions and under the gate electrode, and each of the plurality of projections extends from outside of the convex parts of the gate electrode to fill the intermediate region.

The first main electrode preferably contacts the plurality of projections of the source region at areas adjacent the convex parts of the gate electrode, and contacts the intermediate region in the plurality of base regions at all other points, thereby preventing latch-up.

The insulated gate bipolar transistor may further comprise an emitter layer of the second conductive type formed below the lower side of the base layer, and a second main electrode formed to contact the emitter layer.

The insulated gate bipolar transistor may further comprise a buffer layer of a first conductive type formed between the base layer and the emitter layer.

The primary source regions preferably acts to disperse a hole current flowing in the lower part of the source regions due to the curvature of the source regions, thereby preventing latch-up. The primary source regions also preferably serves as the emitter ballast to prevent latch-up. The emitter ballast increases the potential of the source regions as the hole current increases in the lower part of the primary source regions, thereby preventing latch-up.

The present invention will now described more specifically with reference to the drawings attached only by way of examples.

DETAILED DESCRIPTION OF PREFERRED EMBODIMENTS

Figure 1:
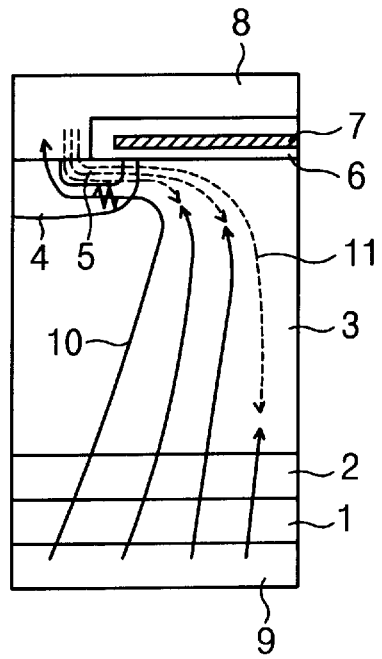
FIG. 1 is a cross sectional view for illustrating the structure of a conventional IGBT.
Figure 2:
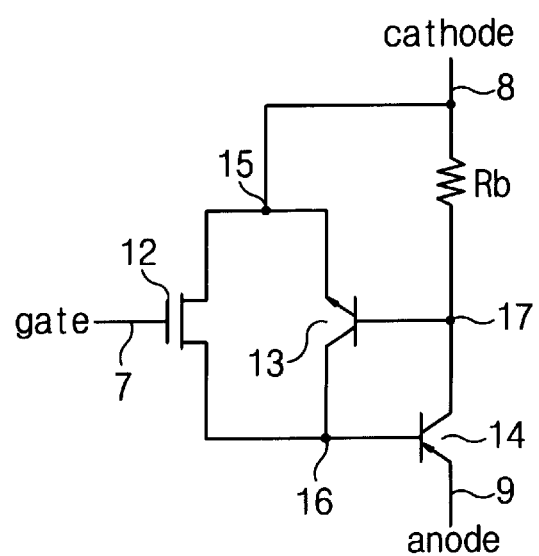
FIG. 2 is an equivalent circuit of FIG. 1.
Figure 3:
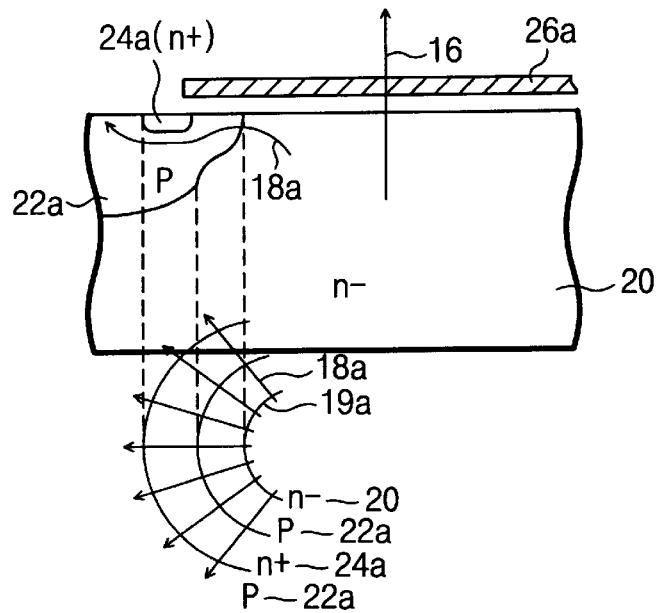
FIGS. 3 to 5 illustrate the hole current flow of an IGBT viewed in plane according to the junction curvature of the base region.

FIG. 3 illustrates the structure of an IGBT device obtained by rotating the device about a central axis 16 of a gate electrode 26a, where a p-type base region 22a has the form of a horizontally sectioned tire with an internal ring-shaped cathode contact electrode (not shown). In this case, the hole current 18a flowing from the anode electrode (not shown) below an n⁻-type base layer 20 to the cathode contact electrode is dispersed radially, so that the current density is reduced in the lower part of an n⁺-type source region 24a to inhibit latch-up. In other words, viewing the device in a plane, the well junction 19a between the n-type base layer 20 and the p-type base region 22a is formed to be concave so as to diverge the hole current 18a, thus preventing latch-up.

Figure 5:
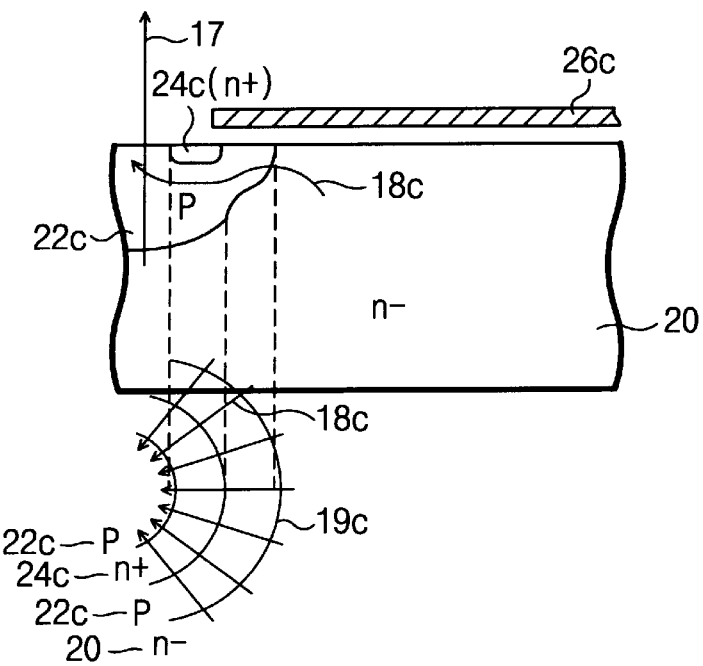

In contrast, FIG. 5 illustrates the structure of an IGBT obtained by rotating the device about a central axis 17 of the p-type base region 22c, where the p-type base region 22c is formed into a bowl type with the cathode contact electrode (not shown) of a small ball type positioned in the center of the p-type base region 22c. The gate electrode 26c is shaped like a ring enclosing the p-type base region 22c.

In this case, the hole current 18c flowing from the anode electrode (not shown) below the n⁻-type base layer 20 is converged to the cathode electrode to increase the current density in the lower part of the n⁺-type source region 24c, thus causing latch-up. In other words, viewing the device in plane, the well junction 19c between the n⁻-type base layer 20 and the p-type base region 22c is formed to be convex so as to converge the hole current 18c, thus initiating latch-up.

While latch-up is generally undesirable, the design shown in FIG. 5 prevents the weak point of the latch-up by being far off the contact plug between the source region and the cathode contact so as to increase the resistance from an emitter-ballast contact.

Figure 4:
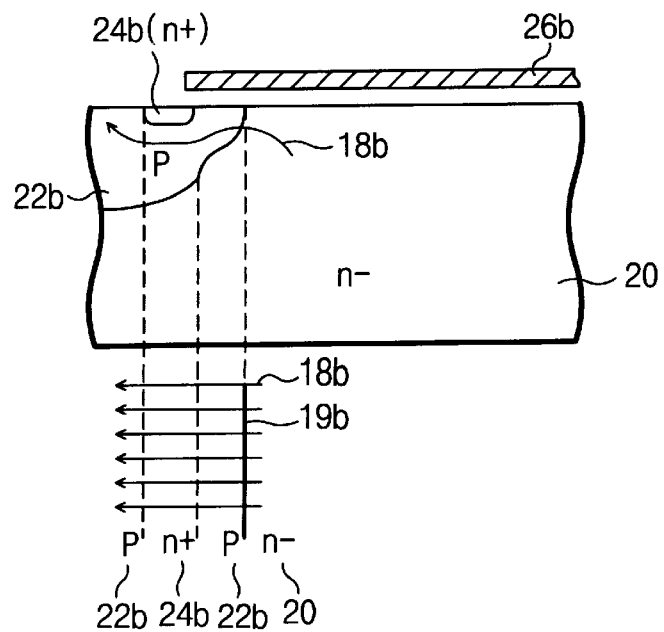

FIG. 4 illustrates the structure of an IGBT which comprises a rectilinearly elongated gate electrode 26b with the p-type base regions 22b formed lengthwise below both sides of the gate electrode 26b. Viewing the device in a plane, the well junction 19b between the n⁻-type base layer 20 and the p-type base regions 22b is rectilinear, providing intermediate characteristics as compared with the concave and convex well junctions 19a and 19c. Of course, the n⁺-type source region 24b is also formed to be elongated in the p-type base region 22b.

Accordingly, it is preferable for an IGBT device to properly have a concave well junction 19a in order to prevent latch-up.

Figure 6:
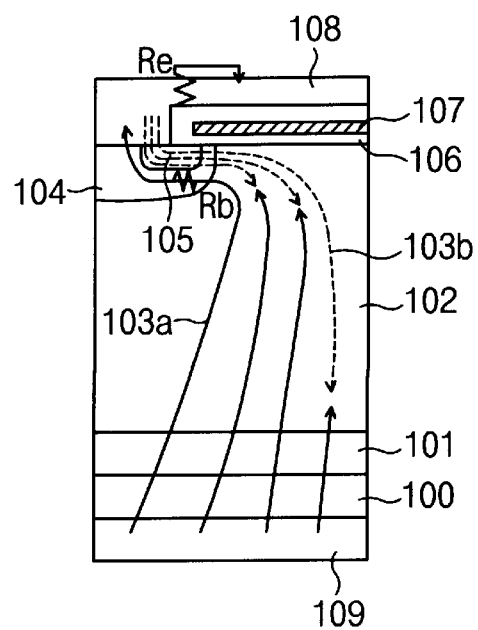
FIG. 6 is a cross sectional view for illustrating the structure of an IGBT with latch-up protection according to a preferred embodiment of the present invention.

Referring to FIG. 6, an IGBT is provided in accordance with a preferred embodiment of the present invention. The IGBT has latch-up protection and includes a p⁺⁺-type emitter layer 100, an n⁺-type buffer layer 101, an n⁻-type base layer 102, p-type base regions 104, n⁺-type source regions 105, an insulating layer 106, a gate electrode 107, a cathode electrode 108, and an anode electrode 109. The p-type base regions 104 are selectively embedded in the surface region of the n⁻-type base layer 102 adjacent to the upper side. The n⁺-type source regions 105 are selectively embedded in the surface regions of the p-type base regions 104 adjacent to the first upper side. The gate electrode 107 is formed over the exposed surface parts of the n⁻-type base layer 102 and the p-type base regions 104 with the insulating layer 106 between them. The insulating layer 106 completely encloses the gate electrode 107, which partly overlaps the p-type base regions 104. The insulating layer also covers parts of the n⁺-type source regions 105. The cathode electrode 108 is formed to contact the n⁺-type source regions 105 or the p-type base regions 104. The p⁺⁺-type emitter layer 100 is formed on the lower side of the n⁻-type base layer 102, contacting the anode electrode 110. Arranged between the p⁺⁺-type emitter layer 100 and the n⁻-type base layer 102 is an n⁺-type buffer layer 101.

In such a structure, latch-up is generated as the potential difference of the p/n junction increases in the edge portion of the n⁺-type source region 105 near the gate electrode 107. In this case, latch-up may be inhibited by increasing the potential of the n⁺-type source region 105 to reduce the potential difference when the potential of the p-type base region 104 is raised with an increase of the hole current 103a. Reference numeral 103b indicates the electron current. To this end, the IGBT is structured to make the n⁺-type source region 105 connected through an emitter ballast resistance Re to the cathode electrode 108.

Figure 7:
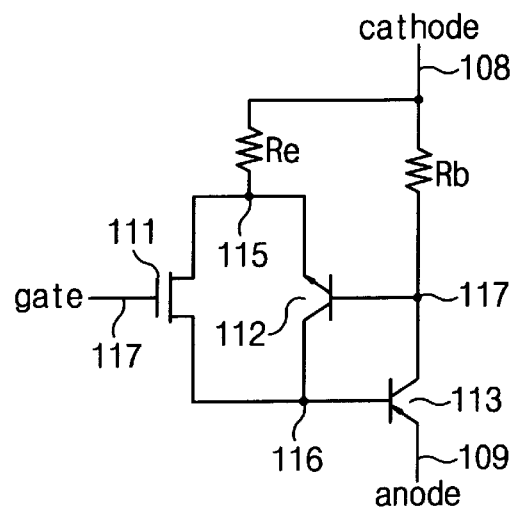
FIG. 7 is an equivalent circuit of FIG. 6.

FIG. 7 is an equivalent circuit to FIG. 6. In particular, with reference to FIG. 7, the 10 IGBT includes the gate electrode 107, the cathode electrode 108, the anode electrode 109, an NMOS transistor 112, two bipolar transistors 113 and 114, first through third nodes 115–116, a first resistor $R_b$, and an emitter balance resistor $R_e$.

The current path of the NMOS transistor 112 is connected in parallel with the NPN transistor 113. The NMOS transistor has its current path connected between the first and second nodes 115 and 116, and its gate connected to the gate electrode 107. The base of the NPN transistor 113 has its emitter connected to the first node 115, its collector connected to the second node 116, and its base connected to the third node 117. The PNP transistor 114 has its emitter connected to the anode electrode 109, its collector connected to the third node 117, and its base connected to the second node 116. The first resistor $R_b$ is connected between he cathode electrode 108 and the third node 117. The emitter ballast resistor Re is connected between the cathode 108 and a first node 115.

The value of the emitter ballast resistor $R_e$ is chosen to be high enough to prevent latch-up as the n⁺-type source region 105 is spaced apart from the position where the cathode electrode 108 contacts the p-type base region 104.

Where the well junction is formed to be rectilinear or convex as shown in FIGS. 4 and 5, a cathode contact electrode 110 used to contact the n⁺-type source region 105 with the cathode electrode 108 is spaced apart from the n⁺-type source region 105 to prevent latch-up. In this case, the emitter ballast resistor $R_e$ is employed to prevent the latch-up.

However, where the well junction is formed to be concave as shown in FIG. 3, the cathode contact electrode 110 contacts the n⁺-type source region 105. In this case, since the well junction is formed to be concave, the hole current is dispersed and latch-up is prevented.

Figure 8:
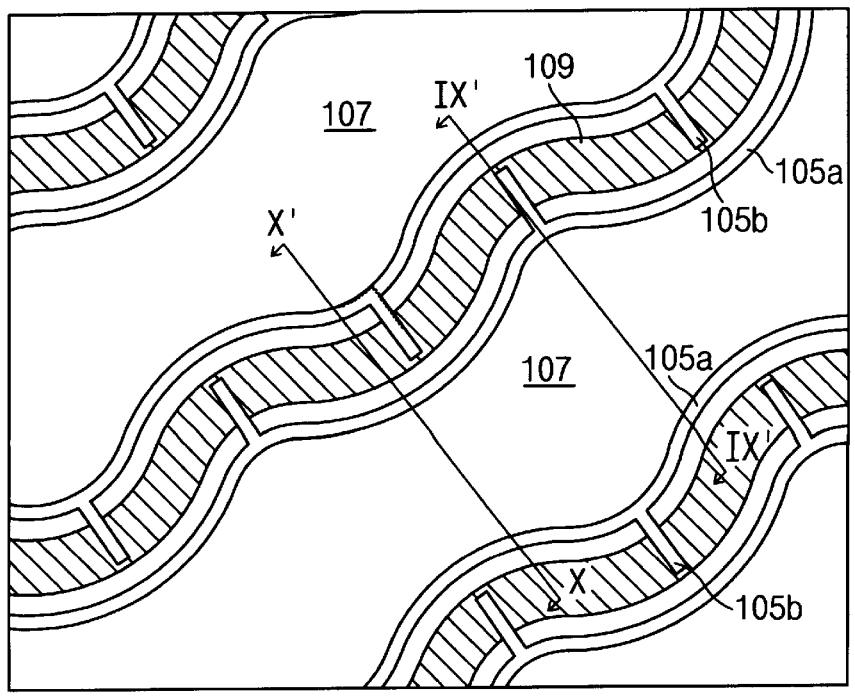
FIG. 8 is a plane view for illustrating the structure of an IGBT with latch-up protection according to a preferred embodiment of the present invention.

FIG. 8 is a plane view for illustrating the structure of an IGBT with latch-up protection according to a preferred embodiment of the present invention. As shown in FIG. 8, the gate electrode 107 is formed into an elongated curved strip in the semiconductor substrate with concave and convex parts. Although FIG. 8 shows a completely curved strip, the gate electrode 107 may include rectilinear parts formed between the concave and convex parts.

An $n^+$-type source region 105 is arranged along both sides of the gate electrode 107. The $n^+$-type source region 105 includes a primary $n^+$-type source region 105a and a plurality of $n^+$-type source projections 105b. The primary $n^+$-type source region 105a is formed with a small width and parallels the gate electrode 107. The $n^+$-type source projections 105b each extend from the concave parts of one side of the gate electrode 107. The cathode contact electrode 110 is provided along one side of the $n^+$-type source region 105a with a space between the two. The cathode contact electrode 110 is periodically overlapped by the $n^+$-type source projections 105b.

Thus, at the convex parts of the gate electrode 107, i.e., the concave well junction, where the hole current is dispersed, the $n^+$-type source projections 105b are provided to directly contact the cathode contact electrode 110. However, at the concave parts of the gate electrode 107, i.e., the convex well junction, where the hole current converges, the $n^+$-type source region 105a is made to not directly contact the cathode contact electrode 110. Instead, the emitter ballast resistor $R_e$ is arranged between the $n^+$-type source region 105a and the cathode contact electrode 110 according the length of the $n^+$-type source projection 105b, thus preventing the latch-up.

Figure 9:
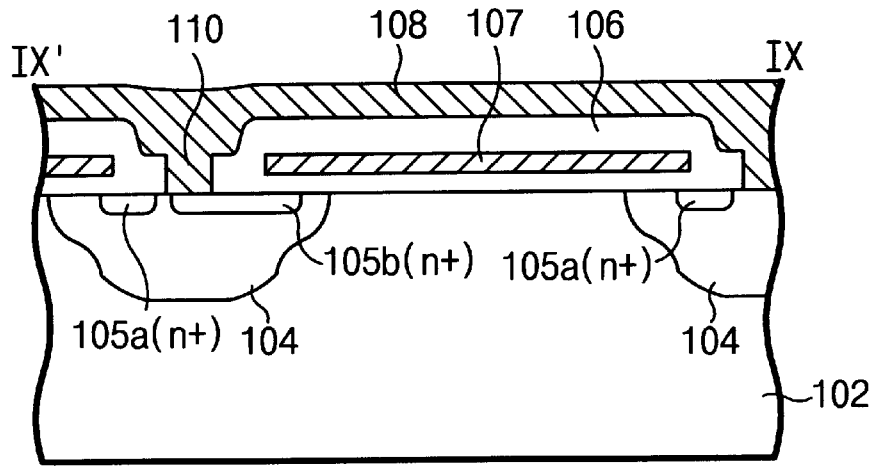
FIG. 9 is a cross-sectional view taken along line IX–IX' of FIG. 8.
Figure 10:
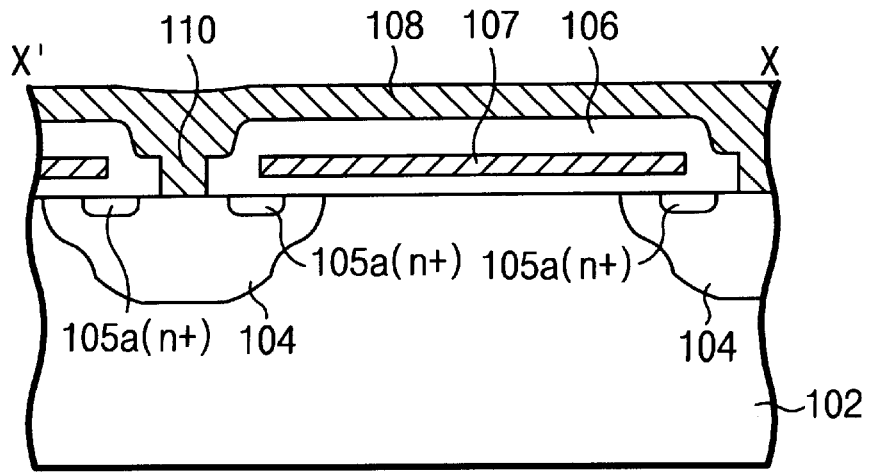
FIG. 10 is a cross-sectional view taken along line X–X' of FIG. 8.

FIG. 9 is a cross-sectional view taken along line IX–IX' of FIG. 8, while FIG. 10 is a cross-sectional view taken along line X–X' of FIG. 8. As shown in FIG. 9, where there is an $n^+$-type source projection 105b, the projection 105b is formed to directly contact the cathode contact electrode 110. In this case, the $n^+$-type source projection 105b may be made to partly or completely overlap the cathode contact electrode 110, while maintaining a given space from the $n^+$-type source region 105a.

On the other hand, where there is no projection 105b as shown in FIG. 10, the $n^+$-type source region 105a does not directly contact the cathode contact electrode 110. Rather, the p-type base region 104 contact the cathode electrode 110.

What is claimed is:

1. An insulated gate bipolar transistor, comprising:
   a plurality of base layers of a first conductive type with upper and lower sides;
   a plurality of base regions of a second conductive type selectively embedded in the upper side of each of the plurality of base layers;
   a plurality of source regions of the first conductive type selectively embedded in the plurality of base regions;
   gate electrode formed over the base layer and the a plurality of base regions;
   an insulating layer formed between the gate electrode and both the base layer and the plurality of base regions; and
   a first main electrode connected to the source region and to the plurality of base regions;
   wherein the gate electrode is formed into an elongated curved line with concave and convex parts,
   wherein each of the plurality of source regions comprises a primary source region and plurality of projections,
   wherein the plurality of primary source regions are formed on both sides of the gate electrode such that an intermediate area is formed adjacent to the source regions in each of the plurality of base regions and under the gate electrode, and each of the plurality of projections extends from outside of the convex parts of the gate electrode to fill the intermediate region, and
   wherein the first main electrode contacts the plurality of projections of the source region at areas adjacent the convex parts of the gate electrode, and contacts the intermediate region in the plurality of base regions at all other points, thereby preventing latch-up.

2. An insulated gate bipolar transistor as recited in claim 1, further comprising:
   an emitter layer of the second conductive type formed below the lower side of the base layer; and
   a second main electrode formed to contact the emitter layer.

3. An insulated gate bipolar transistor as recited in claim 2, further comprising a buffer layer of a first conductive type formed between the base layer and the emitter layer.

4. An insulated gate bipolar transistor as recited in claim 1, wherein the primary source regions disperse a hole current flowing in the lower part of the source regions due to a curvature of the source regions, thereby preventing latch-up.

5. An insulated gate bipolar transistor as recited in claim 2, wherein the primary source regions serve as the emitter ballast to prevent latch-up.

6. An insulated gate bipolar transistor as recited in claim 5, wherein the emitter ballast increases the potential of the source regions as the hole current increases in the lower part of the primary source regions, thereby preventing latch-up.

7. An insulated gate bipolar transistor, comprising:
   a base layer of a first conductive type, having upper and lower sides;
   a plurality of base regions of a second conductive type selectively embedded in the upper side of the base layer;
   a plurality of source regions of a first conductive type selectively embedded in the plurality of base regions;
   a gate electrode formed over the base layer and the plurality of base regions
   an insulating layer formed between the gate electrode and both the base layer and the plurality of base regions;
   a first main electrode connected to the source regions and base regions; and
   wherein the gate electrode is formed into an elongated curved strip with concave, convex, and rectilinear parts,
   wherein each of the plurality of source regions comprises a primary source region and plurality of projections,
   wherein the plurality of primary source regions are formed on both sides of the gate electrode such that an intermediate area is formed adjacent to the source regions in each of the plurality of base regions and under the gate electrode, and each of the plurality of projections extends from outside of the convex parts of the gate electrode to fill the intermediate region, and
   wherein the first main electrode contacts the plurality of projections of the source region at areas adjacent the convex parts of the gate electrode, and contacts the intermediate region in the plurality of base regions at all other points, thereby preventing latch-up.

8. An insulated gate bipolar transistor as recited in claim 7, further comprising an emitter layer of a second conductive type formed on the lower side of the base layer;

a second main electrode formed to contact the emitter layer.

9. An insulated gate bipolar transistor as recited in claim 8, further comprising a buffer layer of a first conductive type formed between the base layer and the emitter layer.

10. An insulated gate bipolar transistor as recited in claim 7, wherein the primary source regions disperse the hole current flowing in the lower part of the source regions due to a curvature of the primary source regions, thereby preventing latch-up.

11. An insulated gate bipolar transistor as recited in claim 8, wherein the primary source regions serve as the emitter ballast to prevent latch-up.

12. An insulated gate bipolar transistor as recited in claim 11, wherein the emitter ballast increases the potential of the source regions as the hole current increases in the lower part of the primary source regions, thereby preventing latch-up.

* * * * *